(12) United States Patent
Park et al.

(10) Patent No.: US 12,527,143 B2
(45) Date of Patent: Jan. 13, 2026

(54) MANUFACTURING METHOD FOR DISPLAY DEVICE, MANUFACTURING METHOD FOR LIGHT EMITTING ELEMENT, AND DISPLAY DEVICE

(71) Applicant: Samsung Display Co., LTD., Yongin-si (KR)

(72) Inventors: Ji Eun Park, Yongin-si (KR); Seul Ki Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 311 days.

(21) Appl. No.: 18/328,098

(22) Filed: Jun. 2, 2023

(65) Prior Publication Data

US 2024/0113151 A1   Apr. 4, 2024

(30) Foreign Application Priority Data

Sep. 29, 2022   (KR) .......................... 10-2022-0124504

(51) Int. Cl.
    *H10H 29/14*   (2025.01)
(52) U.S. Cl.
    CPC ................................ *H10H 29/142* (2025.01)

(58) Field of Classification Search
    None
    See application file for complete search history.

(56) References Cited

U.S. PATENT DOCUMENTS 10,847,591 B1 * 11/2020 Kim ................. H10K 71/00
2015/0236280 A1 * 8/2015 Sakuishi ............. B32B 37/10
                                                  156/247

FOREIGN PATENT DOCUMENTS

KR       10-1973855       8/2019

\* cited by examiner

*Primary Examiner* — Michael Lebentritt
(74) *Attorney, Agent, or Firm* — Womble Bond Dickinson (US) LLP

(57) ABSTRACT

A manufacturing method for a display device includes patterning a pixel defining pattern on a substrate; forming an emission stack structure; forming light emitting elements by etching the emission stack structure; and transferring the light emitting elements on a base layer and a pixel circuit layer including a pixel circuit on the base layer. The forming of the light emitting elements includes patterning the light emitting elements in an element forming area enclosed by the pixel defining pattern. The transferring of the light emitting elements includes disposing the light emitting elements in a sub-pixel area corresponding to the element forming area on the pixel circuit layer.

20 Claims, 16 Drawing Sheets

LE: SCL1, AL, SCL2, ELL

170: 170a, 170b

MANUFACTURING METHOD FOR DISPLAY DEVICE, MANUFACTURING METHOD FOR LIGHT EMITTING ELEMENT, AND DISPLAY DEVICE

CROSS-REFERENCE TO RELATED APPLICATION(S)

This application claims priority to and benefits of Korean patent application number 10-2022-0124504 under 35 U.S.C. § 119 filed on Sep. 29, 2022 in the Korean Intellectual Property Office, the entire contents of which are incorporated herein by reference.

BACKGROUND

1. Technical Field

Various embodiments relate to a manufacturing method for a display device, a manufacturing method for a light emitting element, and a display device.

2. Description of Related Art

Recently, as interest in information display increases, research and development on display devices have been continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Various embodiments are directed to a display device which is improved in alignment of light emitting elements, a manufacturing method for the display device, and a manufacturing method for a light emitting element.

Various embodiments are directed to a display device capable of precisely controlling the number of light emitting elements that function as valid light sources and the quantity of light emitted from the light emitting elements, a manufacturing method for the display device, and a manufacturing method for a light emitting element.

An embodiment may provide a manufacturing method for a display device that may include patterning a pixel defining pattern on a substrate; forming an emission stack structure; forming light emitting elements by etching the emission stack structure; and transferring the light emitting elements on a base layer and a pixel circuit layer including a pixel circuit on the base layer. The forming of the light emitting elements may include patterning the light emitting elements in an element forming area enclosed by the pixel defining pattern. The transferring of the light emitting elements may include disposing the light emitting elements in a sub-pixel area corresponding to the element forming area on the pixel circuit layer.

In an embodiment, the shape of the element forming area and the shape of the sub-pixel area may be substantially identical.

In an embodiment, the patterning of the pixel defining pattern may be performed before forming the light emitting elements.

In an embodiment, the manufacturing method may further include forming a pixel boundary line by removing the pixel defining pattern. The light emitting elements may not overlap the pixel boundary line in a plan view.

In an embodiment, the forming of the light emitting elements may further comprise disposing the light emitting elements in an area enclosed by the pixel boundary line.

In an embodiment, the transferring of the light emitting elements may include determining a transfer position of the light emitting elements based on the pixel boundary line.

In an embodiment, the transferring of the light emitting elements may be performed using at least one of apparatuses each using at least one of a transfer using a stamp, a transfer using a laser, a transfer using an electrostatic force, a transfer using a magnetic force and an electromagnetic force, and a transfer using an adhesive.

In an embodiment, the transferring of the light emitting elements may include disposing the light emitting elements on a bonding electrode disposed on the pixel circuit layer.

In an embodiment, each of the light emitting elements on the bonding electrode may form a substantially identical surface area in an electrical contact surface with the bonding electrode.

In an embodiment, the element forming area and the sub-pixel area may be one to one with each other.

In an embodiment, the element forming area may include element forming areas. The sub-pixel area may include sub-pixel areas. An arrangement structure of the element forming areas may be substantially identical to an arrangement structure of the sub-pixel areas.

In an embodiment, the transferring of the light emitting elements may include collectively transferring the light emitting elements disposed in the element forming areas to the sub-pixel areas.

In an embodiment, the pixel defining pattern may include an inorganic material.

In an embodiment, the forming of the emission stack structure may include forming a first base semiconductor layer including a first type semiconductor, a base active layer, and a second base semiconductor layer including a second type semiconductor different from the first type semiconductor.

In an embodiment, the manufacturing method may further include forming a photoresist layer to form an etching mask for the emission stack structure on the emission stack structure. The photoresist layer may not overlap the pixel defining pattern in a plan view.

An embodiment may provide a manufacturing method for a light emitting device that may include patterning a pixel defining pattern that encloses an element forming area including light emitting elements area on a substrate; and forming an emission stack structure on the substrate, and forming light emitting elements by etching the emission stack structure such that the light emitting elements are selectively disposed in the element forming area.

An embodiment may provide a display device that may include a pixel circuit layer including a base layer and a pixel circuit; and a light-emitting-element layer disposed on the pixel circuit layer, and including a first electrode, light emitting elements, and a second electrode. The light emitting elements may be electrically connected to the first electrode and the second electrode, and disposed on the first electrode. Each of the light emitting elements may have a substantially identical surface area in an electrical contact surface with the first electrode.

In an embodiment, the pixel circuit layer may include a driving transistor. The first electrode may electrically connect the driving transistor with the light emitting elements.

In an embodiment, the light emitting elements may entirely overlap the first electrode, in a plan view.

In an embodiment, the display device may further include a first sub-pixel and a second sub-pixel each including the first electrode and the light emitting elements. The first electrode of the first sub-pixel may be electrically disconnected from the first electrode of the second sub-pixel. The light emitting elements of the first sub-pixel may be electrically disconnected from the first electrode of the second sub-pixel. The light emitting elements of the second sub-pixel may be electrically disconnected from the first electrode of the first sub-pixel.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
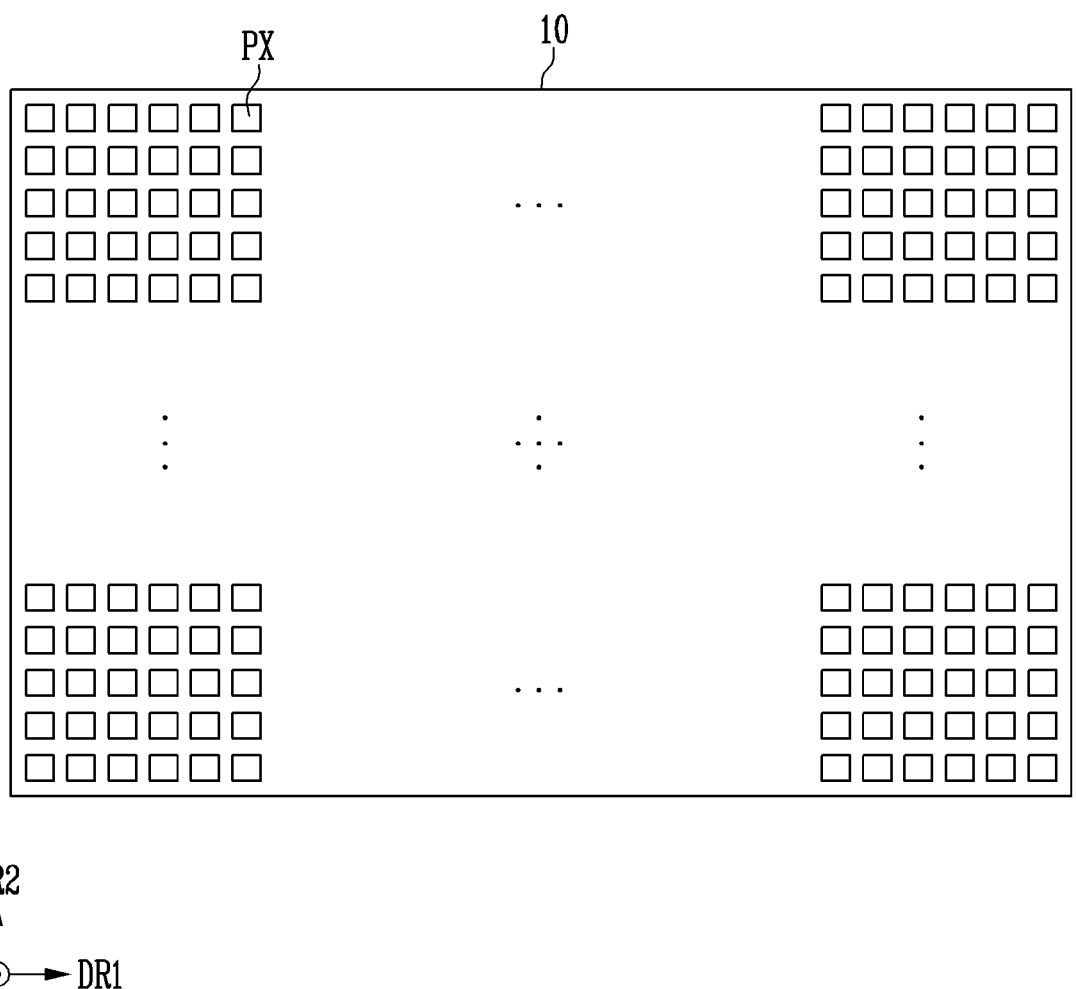
FIG. 1 is a schematic plan view illustrating a display device in accordance with an embodiment.

As the disclosure allows for various changes and numerous embodiments, embodiments will be illustrated in the drawings and described in detail in the written description. However, this is not intended to limit the disclosure to particular modes of practice, and it is to be appreciated that all changes, equivalents, and substitutes within the spirit and technical scope of the disclosure are encompassed in the disclosure.

In the drawings, sizes, thicknesses, ratios, and dimensions of the elements may be exaggerated for ease of description and for clarity. Like numbers refer to like elements throughout.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be further understood that the terms "comprise", "include", "have", etc. when used in the disclosure, specify the presence of stated features, integers, steps, operations, elements, components, and/or combinations of them but do not preclude the presence or addition of one or more other features, integers, steps, operations, elements, components, and/or combinations thereof.

Furthermore, in case that a first part such as a layer, a film, a region, or a plate is disposed on a second part, the first part may be not only directly on the second part but a third part (or other parts) may intervene between them. When it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under or below a second part, the first part may be not only directly under or below the second part but a third part or other parts may intervene between them.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Various embodiments relate to a manufacturing method for a display device, a manufacturing method for a light emitting element, and a display device. Hereinafter, the manufacturing method for the display device, the manufacturing method for the light emitting element, and the display device in accordance with an embodiment will be described with reference to the attached drawings.

Figure 2:
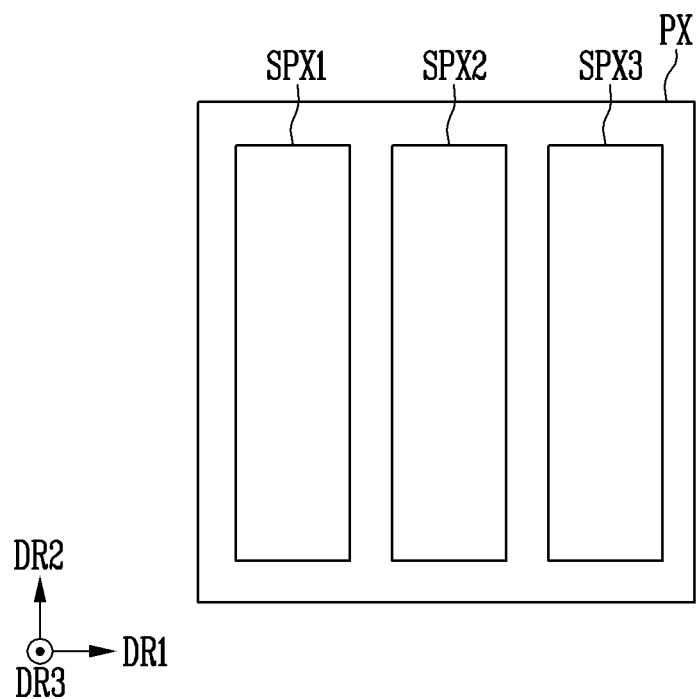
FIG. 2 is a schematic diagram illustrating an example of a pixel of FIG. 1.

Hereinafter, a display device 10 in accordance with an embodiment will be described with reference to FIGS. 1 to 3. FIG. 1 is a schematic plan view illustrating a display device in accordance with an embodiment. FIG. 2 is a schematic diagram illustrating an example of a pixel PX of FIG. 1.

Referring to FIG. 1, the display device 10 may output optical information. For example, the display device 10 may be a device that displays a video or a static image, and may be applied to various devices. The display device 10 may be formed of a rectangular panel having long sides extending in a first direction DR1, and short sides extending a second direction DR2 intersecting the first direction DR1. Corners where the long sides extending in the first direction DR1 and the short sides extending in the second direction DR2 meet may be rounded with a given curvature or may be formed at a right angle. The plane shape of the display device 10 is not limited to a rectangular shape, and may have other polygonal shapes, a circular shape, or an elliptical shape. The display device 10 may be formed to be planar, but it is not limited thereto. For example, the display device 10 may include a curved surface which is formed on each of left and right side edges thereof and has a constant curvature or a varying curvature. The display device 10 may be formed to be flexible so that the display device 10 can be bent, curved, folded, or rolled.

The display device 10 may further include pixels PX that display an image, scan lines extending in the first direction DR1, and data lines extending in the second direction DR2. The pixels PX may be arranged or disposed in the form of a matrix in the first direction DR1 and the second direction DR2.

Each of the pixels PX may include sub-pixels SPX1, SPX2, and SPX3, as illustrated in FIG. 2. Although FIG. 2 illustrates that each of the pixels PX may include three sub-pixels SPX1, SPX2, and SPX3, for example, a first sub-pixel SPX1, a second sub-pixel SPX2, and a third sub-pixel SPX3, the disclosure is not limited thereto.

The first sub-pixel SPX1, the second sub-pixel SPX2, and the third sub-pixel SPX3 may be connected to at least one data line among the data lines and at least one scan line among the scan lines.

Each of the first sub-pixel SPX1, the second sub-pixel SPX2, and the third sub-pixel SPX3 may have a rectangular shape, a square shape, or a rhombus shape, in a plan view. For example, each of the first sub-pixel SPX1, the second sub-pixel SPX2, and the third sub-pixel SPX3 may have a rectangular planar shape having short sides extending in the first direction DR1 and long sides extending in the second direction DR2, as illustrated in FIG. 2. For example, in an embodiment, each of the first sub-pixel SPX1, the second sub-pixel SPX2, and the third sub-pixel SPX3 may have a square or rhombus planar shape having sides having a same length in the first direction DR1 and the second direction DR2.

As illustrated in FIG. 2, the first sub-pixel SPX1, the second sub-pixel SPX2, and the third sub-pixel SPX3 may be arranged or disposed in the first direction DR1. For example, the first sub-pixel SPX1 and any one of the second sub-pixel SPX2 and the third sub-pixel SPX3 may be arranged or disposed in the first direction DR1, and a remaining one and the first sub-pixel SPX1 may be arranged or disposed in the second direction DR2.

For example, the second sub-pixel SPX2 and any one of the first sub-pixel SPX1 and the third sub-pixel SPX3 may be arranged or disposed in the first direction DR1, and a remaining one and the second sub-pixel SPX1 may be arranged or disposed in the second direction DR2. As a further example, the third sub-pixel SPX3 and any one of the first sub-pixel SPX1 and the second sub-pixel SPX2 may be arranged or disposed in the first direction DR1, and a remaining one and the third sub-pixel SPX3 may be arranged or disposed in the second direction DR2.

The first sub-pixel SPX1 may emit a first color of light. The second sub-pixel SPX2 may emit a second color of light. The third sub-pixel SPX3 may emit a third color of light. Here, the first color may be light in a red wavelength band. The second color may be light in a green wavelength band. The third color may be light in a blue wavelength band. The red wavelength band may be a wavelength band ranging from approximately 600 nm to approximately 750 nm. The green wavelength band may be a wavelength band ranging from approximately 480 nm to approximately 560 nm. The blue wavelength band may be a wavelength band ranging from approximately 370 nm to approximately 460 nm. However, embodiments are not limited to the foregoing.

Each of the first sub-pixel SPX1, the second sub-pixel SPX2, and the third sub-pixel SPX3 may include an inorganic light emitting element having an inorganic semiconductor as a light emitting element LE (refer to FIG. 3) to emit light.

As illustrated in FIG. 2, the surface area of the first sub-pixel SPX1, the surface area of the second sub-pixel SPX2, and the surface area of the third sub-pixel SPX3 may be substantially the same as each other, but the disclosure is not limited thereto. At least any one of the surface area of the first sub-pixel SPX1, the surface area of the second sub-pixel SPX2, and the surface area of the third sub-pixel SPX3 may be different from another one. For example, any two of the surface area of the first sub-pixel SPX1, the surface area of the second sub-pixel SPX2, and the surface area of the third sub-pixel SPX3 may be substantially the same as each other, and a remaining one may be different from the two. For example, the surface area of the first sub-pixel SPX1, the surface area of the second sub-pixel SPX2, and the surface area of the third sub-pixel SPX3 may be different from each other.

Figure 3:
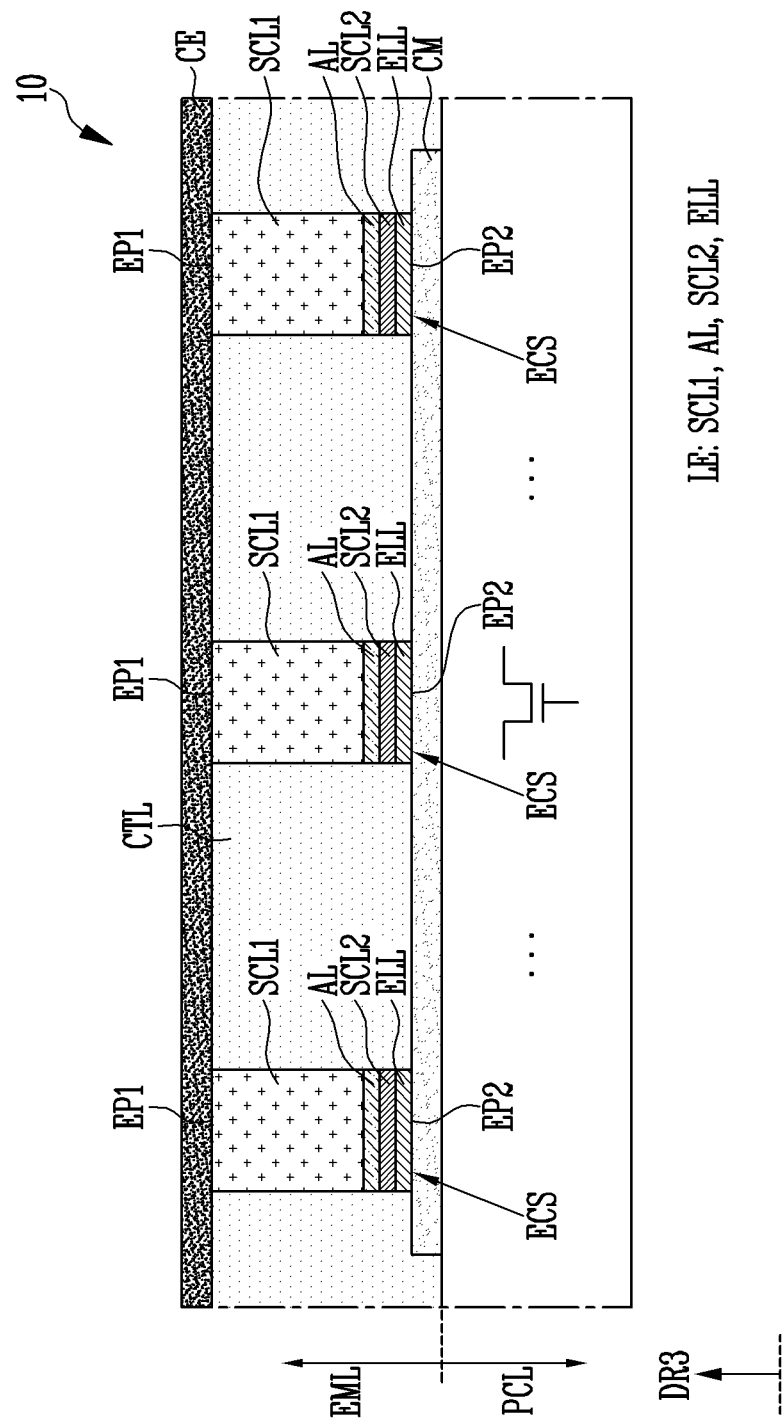
FIG. 3 is a schematic cross-sectional view illustrating an example of a display device.

FIG. 3 is a schematic cross-sectional view illustrating an example of a display device. Referring to FIG. 3, the display device 10 may include a pixel circuit layer PCL, and a light-emitting-element layer EML.

The pixel circuit layer PCL may be a layer including a pixel circuit for driving light emitting elements LE. The pixel circuit layer PCL may include a substrate, metal layers provided to form pixel circuits, and insulating layers disposed between the metal layers. In an embodiment, the substrate may be a base substrate or a base component for supporting the display device 10. The substrate may be a rigid substrate made of glass. For example, the substrate may be a flexible substrate which can be bent, folded, or rolled. The substrate may include an insulating material such as polymer resin, for example, polyimide. In an embodiment, the pixel circuits each may include a thin film transistor. The pixel circuits each may further include a storage capacitor. The pixel circuits may be electrically connected to the light emitting elements LE, and may provide electrical signals allowing the light emitting elements LE to emit light.

The light-emitting-element layer EML may be disposed on the pixel circuit layer PCL. The light-emitting-element layer EML may include a first electrode CM, a light emitting element LE, and a second electrode CE. In an embodiment, the light-emitting-element layer EML may further include an intermediate layer CTL.

The first electrode CM may be disposed on the pixel circuit layer PCL. The first electrode CM may be disposed under or below the light emitting element LE and electrically connected to the light emitting element LE. For example, the first electrode CM may be electrically connected to the light emitting element LE through a second end EP2 of the light emitting element LE that is adjacent to a second semiconductor layer SCL2 of the light emitting element LE.

The first electrode CM may be electrically connected to a pixel circuit (for example, a driving transistor) formed in the pixel circuit layer PCL, so that the first electrode CM can be supplied with an electrical signal (for example, a driving signal as an anode signal) for driving the light emitting elements LE. The second electrode CE may be electrically connected to a power line, so that a voltage of the power line can be supplied to the light emitting element LE. The second electrode CE may be a cathode electrode and be supplied with a cathode signal.

In an embodiment, an electrical signal allowing the light emitting elements LE to emit light may be applied to the first electrode CM. The electrical signal may be applied to each of the light emitting elements LE through an electrical contact surface ECS between the light emitting element LE and the first electrode CM. Here, the quantity of light emitted from each of the light emitting elements LE may be changed depending on the intensity of the applied electrical signal (for example, the intensity of current). Therefore, to make the intensity of light emitted from each of the sub-pixels SPX1, SPX2, and SPX3 uniform, there is need for the sum of surface areas of electrical contact surfaces ECS between the light emitting elements LE and the first electrode CM to be similar between the sub-pixels SPX1, SPX2, and SPX3. For example, to enable each of the sub-pixels SPX1, SPX2, and SPX3 to emit light at a desired intensity, there is need for the sum of surface areas of electrical contact surfaces ECS between the light emitting elements LE and the first electrode CM to be precisely controlled.

In an embodiment, in each of the sub-pixels SPX1, SPX2, and SPX3, the sum of surface areas of contact surfaces between the light emitting elements LE and the first electrode CM may be uniform or vary within a range desired in case that the display device 10 is manufactured. In an embodiment, in each of the sub-pixels SPX1, SPX2, and SPX3, the light emitting elements LE each may have a same surface area in the electrical contact surface ECS with the first electrode CM. Therefore, the intensities of light to be emitted from two or more separate sub-pixels SPX1, SPX2, and SPX3 can be precisely controlled. The reason for the foregoing may be because the light emitting elements LE are patterned in defined areas corresponding to areas of the sub-pixels SPX1, SPX2, and SPX3 during a process for manufacturing the light emitting elements LE. Detailed description pertaining to the foregoing will be made along with description of a manufacturing method for the display device 10.

The second electrode CE may be disposed over the light emitting element LE and electrically connected to the light emitting element LE. For example, the second electrode CE may be electrically connected to the light emitting element LE through a first end EP1 of the light emitting element LE that is adjacent to a first semiconductor layer SCL1 of the light emitting element LE.

In an embodiment, the first electrode CM may be a pixel electrode for the light emitting elements LE, and the second electrode CE may be a common electrode for the light emitting elements LE. The first electrode CM and the second electrode CE may be disposed to face each other with the light emitting elements LE interposed therebetween.

The first electrode CM and the second electrode CE may include conductive material. For example, the first electrode CM may include one or more selected from the group consisting of silver (Ag), magnesium (Mg), aluminum (Al), platinum (Pt), palladium (Pd), gold (Au), nickel (Ni), neodymium (Nd), iridium (Ir), chrome (Cr), titanium (Ti). The second electrode CE may include one or more selected from the group consisting of conductive oxide such as indium tin oxide (ITO), indium zinc oxide (IZO), zinc oxide ($ZnO_x$), indium gallium zinc oxide (IGZO), and indium tin zinc oxide (ITZO), and a conductive polymer such as poly(3,4-ethylenedioxythiophene) (PEDOT). However, the disclosure is not limited to the foregoing example.

The intermediate layer CTL may be disposed on the pixel circuit layer PCL and the first electrode CM, and may be disposed between the light emitting elements LE. The intermediate layer CTL may include organic material to stably fix the light emitting elements LE and reinforce adhesive force between the light emitting elements LE and the first electrode CM. For example, the intermediate layer CTL may be a transparent temporary adhesive layer (or a transparent bonding layer), but the intermediate layer CTL may include organic material.

The light emitting elements LE may be disposed on the first electrode CM, and electrically connected to the first electrode CM. The light emitting elements LE may be provided in each of the sub-pixels SPX1, SPX2, and SPX3.

The light emitting element LE may emit light. The light emitting element LE may include a first semiconductor layer SCL1, a second semiconductor layer SCL2, and an active layer AL disposed between the first semiconductor layer SCL1 and the second semiconductor layers SCL2. In an embodiment, the light emitting element LE may further include an electrode layer ELL. The light emitting element LE may have various shapes. For example, the light emitting element LE may have a pillar-like shape extending in one direction or a direction. However, the disclosure is not limited to the foregoing example.

The light emitting element LE may have various sizes. For example, the light emitting element LE may have a size ranging from the nanometer scale to the micrometer scale. The size of light emitting element LE is not limited to a given numerical range.

The light emitting element LE may include the first end EP1 and the second end EP2. In an embodiment, the first semiconductor layer SCL1 may be adjacent to the first end EP1 of the light emitting element LE. The second semiconductor layer SCL2 may be adjacent to the second end EP2. The electrode layer ELL may be adjacent to the second end EP2.

The first semiconductor layer SCL1 may include a first conductive semiconductor. The first semiconductor layer SCL1 may be disposed on the active layer AL and include a semiconductor layer having a type different from that of the second semiconductor layer SCL2. For example, the first semiconductor layer SCL1 may include an N-type semiconductor layer. For example, the first semiconductor layer SCL1 may include one or more selected from the group consisting of InAlGaN, GaN, AlGaN, InGaN, AlN, and InN, and may include an N-type semiconductor layer doped with a first conductive dopant such as Si, Ge, and Sn. However, the disclosure is not limited thereto. The first semiconductor layer SCL1 may include various materials.

The active layer AL may be disposed between the first semiconductor layer SCL1 and the second semiconductor layer SCL2. The active layer AL may include a single-quantum well structure or a multi-quantum well structure. The location of the active layer AL may be changed in various ways depending on the type of the light emitting element LE, rather than being limited to a given example.

A cladding layer doped with a conductive dopant may be formed on one side or a side of the active layer AL and/or the other side thereof. For example, the cladding layer may include one or more of AlGaN and InAlGaN. However, the disclosure is not limited to the foregoing example.

The second semiconductor layer SCL2 may include a second conductive semiconductor. The second semiconductor layer SCL2 may be disposed on the active layer AL and include a semiconductor layer of a type different from that of the first semiconductor layer SCL1. For example, the second semiconductor layer SCL2 may include a P-type semiconductor layer. For example, the second semiconductor layer SCL2 may include one or more semiconductor materials selected from the group consisting of InAlGaN, GaN, AlGaN, InGaN, AlN, and InN, and may include an P-type semiconductor layer doped with a second conductive dopant such as Ga, B, and Mg. However, the disclosure is not limited thereto. The second semiconductor layer SCL2 may include various materials.

In the case where a voltage equal to or greater than a threshold voltage is applied between the first end EP1 and the second end EP2 of the light emitting element LE that are electrically connected to the first electrode CM and the second electrode CE, the light emitting element LE may emit light by coupling of electron-hole pairs in the active layer AL. Since light emission of the light emitting element LE can be controlled based on the foregoing principle, the light emitting element LE may be used as a light source in various devices.

The electrode layer ELL may be disposed on the second semiconductor layer SCL2. The electrode layer ELL may be adjacent to the second end EP2. A portion of the electrode layer ELL may be exposed, so that the electrode layer ELL can contact the first electrode CM. In an embodiment, the electrode layer ELL may include one or more selected from the group consisting of chrome (Cr), titanium (Ti), aluminum (Al), gold (Au), nickel (Ni), and oxide or an alloy thereof. However, the disclosure is not limited to the foregoing example.

The first electrode CM may be a bonding electrode. The light emitting elements LE may be bonded to the first electrode CM. For example, the light emitting elements LE may be transferred on the first electrode CM by various transfer schemes, and may be bonded to the first electrode CM by a bonding scheme and thus electrically connected to the first electrode CM. An anisotropic conductive film (ACF) bonding scheme, a laser assist bonding (LAB) scheme, an ultrasonic bonding scheme, a ball grid array (BGA) bonding scheme, a thermo compression (TC) bonding scheme, and the like may be used as the bonding scheme. The TC bonding scheme may refer to a scheme in which the light emitting element LD and the first electrode CM contact each other and are heated to a temperature higher than a melting point of the first electrode CM and compressed so that the light emitting element LE and the first electrode CM can be electrically and/or physically connected to each other.

A stacked structure of the display device 10 is not limited to the foregoing example. In an embodiment, the display device 10 may further include additional layers (for example, a color filter, and an outer film).

Hereinafter, a manufacturing method for the display device 10 in accordance with an embodiment will be described with reference to FIGS. 4 to 12. Descriptions overlapping that of the embodiments described above will be simplified, or may not be repeated.

Figure 4:
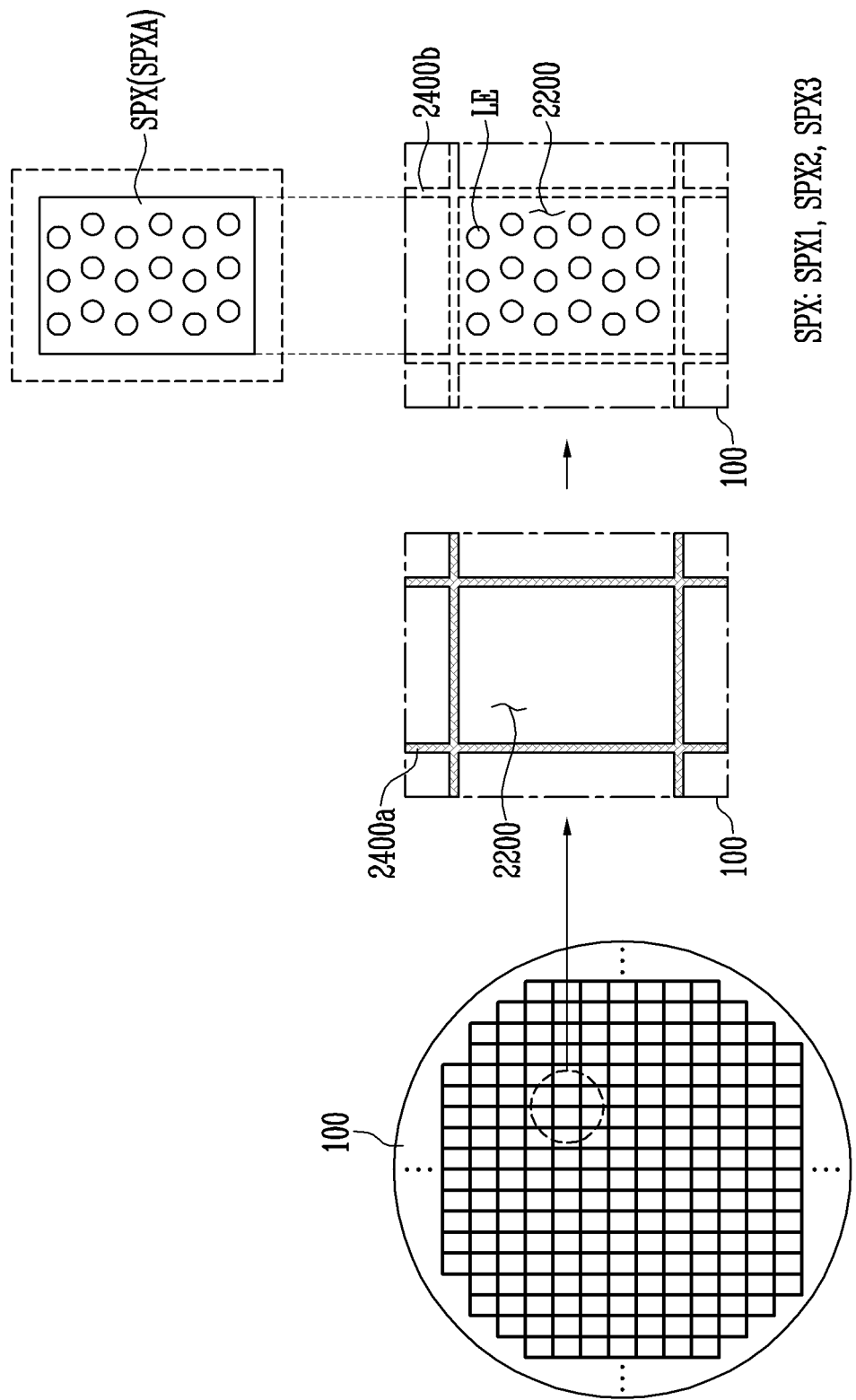
FIGS. 4 and 5 are schematic cross-sectional views schematically illustrating a manufacturing method for the display device in accordance with an embodiment.
Figure 5:
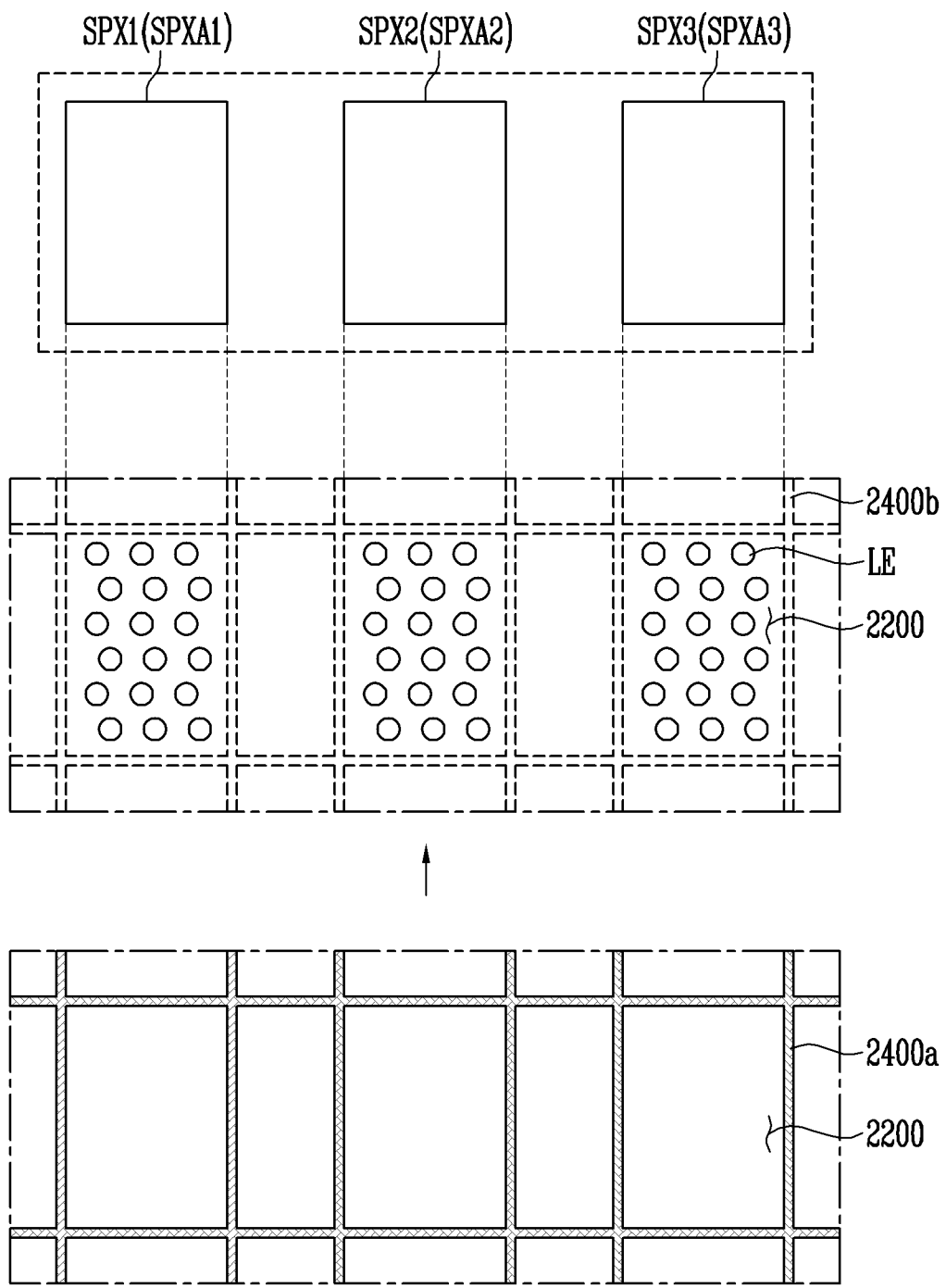

FIGS. 4 to 5 are schematic cross-sectional views schematically illustrating a manufacturing method for the display device in accordance with an embodiment. For example, FIG. 4 is a schematic diagram schematically illustrating a manufacturing method for the display device 10 in accordance with a first embodiment. FIG. 5 is a schematic diagram schematically illustrating a manufacturing method for the display device 10 in accordance with a second embodiment.

FIGS. 6 to 12 are schematic cross-sectional views illustrating, by process steps, a manufacturing method for the display device in accordance with an embodiment. For example, FIGS. 6 to 12 illustrate a process of patterning light emitting element LE and a subsequent process of transferring the light emitting elements LE on the pixel circuit layer PCL.

First, the manufacturing method for the display device 10 in accordance with the first embodiment will be schematically described with reference to FIG. 4.

Referring to FIG. 4, before the light emitting elements LE are patterned (or formed) on a growth substrate 100 (or, substrate), a pixel defining pattern 2400a for defining an element forming area 2200 may be formed.

For example, the pixel defining pattern 2400a may be patterned on the growth substrate 100. Here, the element forming area 2200 enclosed by the pixel defining pattern 2400a may correspond to a sub-pixel area SPXA allowing the light emitting elements LE to be transferred thereon. A shape of the element forming area 2200 is not limited to a shape shown in the drawings, and may be changed in various ways depending on a shape of the sub-pixel area SPXA.

In an embodiment, element forming areas 2200 may be formed, sub-pixel areas SPXA may be formed. Here, the element forming areas 2200 and the sub-pixel areas SPXA may match one to one with each other. For example, the shape of the element forming area 2200 may be substantially the same as the shape of the sub-pixel area SPXA. The size of the element forming area 2200 may be substantially the same as the size of the sub-pixel area SPXA.

Here, the sub-pixel area SPXA may be an area of a sub-pixel SPX in which the light emitting elements LE are to be disposed. The sub-pixel SPX may be one or more of the first to third sub-pixels SPX1, SPX2, and SPX3 described above.

In an embodiment, because the pixel defining pattern 2400a is formed before the light emitting elements LE are individually patterned, an area in which the light emitting elements LE are to be disposed may accurately correspond to the sub-pixel area SPXA to be formed later.

For example, at a time point at which the light emitting elements LE are patterned, the pixel defining pattern 2400a may have been formed. In the area in which the pixel defining pattern 2400a is formed, the light emitting elements LE may not be patterned. Therefore, in the case where the pixel defining pattern 2400a is removed and a pixel boundary line 2400b is formed, the light emitting elements LE may not overlap the pixel boundary line 2400b. The light emitting elements LE are restrictively disposed in an internal area of the element forming area 2200, so that, in case that transferred to each of the sub-pixel areas SPXA, the light emitting elements LE can be prevented from being transferred over the boundary of the sub-pixel areas SPXA.

In an embodiment, in case that the light emitting elements LE are patterned, the light emitting elements LE may be selectively formed in an area that encloses a preset area. Hence, a risk of abnormal transfer of the light emitting elements LE can be substantially prevented from occurring.

For example, because the light emitting elements LE may be patterned on the growth substrate 100 to correspond to the sub-pixel area SPXA in which the light emitting elements LE are to be transferred later, a process of accurately aligning transfer areas in which the light emitting elements LE are to be transferred can be reliably performed before the light emitting elements LE are transferred on the pixel circuit layer PCL. Experimentally, the light emitting elements LE each have an extremely small size, so that if a process of aligning the transfer areas of the light emitting elements LE is performed based on a distance between the light emitting elements LE, the difficulty level of the process may be excessively high. However, in an embodiment, based on the element forming area 2200 determined according to the pixel defining pattern 2400a, the light emitting elements LE may be transferred on the sub-pixel area SPXA. In other words, transfer positions of the light emitting elements LE are not specified based on individual positions of the respective light emitting elements LE, but the transfer positions of the light emitting elements LE may be determined (or specified) on the pixel circuit layer PCL based on the element forming area 2200 specified according to the pixel defining pattern 2400a. Consequently, process convenience may be substantially enhanced, and alignment of the light emitting elements LE may be substantially improved.

As an example, as described above, the light emitting elements LE may not be formed in the pixel defining pattern 2400a, which defines the element forming area 2200 that is an area corresponding to the sub-pixel area SPXA, and the accompanying pixel boundary line 2400b. For example, the light emitting elements LE that are disposed on the first electrode CM of the first sub-pixel SPX1 can be prevented from being removed from the area in which the first sub-pixel SPX1 is formed, and thus can be prevented from being electrically connected to the first electrode CM of the second sub-pixel SPX2. The light emitting elements LE that are disposed on the first electrode CM of the second sub-pixel SPX2 can be prevented from being removed from the area in which the second sub-pixel SPX2 is formed, and thus can be prevented from being electrically connected to the first electrode CM of the first sub-pixel SPX1. In other words, a risk of unnecessary formation of light emitting elements LE on the boundary line of each of the sub-pixel areas SPXA can be prevented from occurring, so that a short-circuit defect between adjacent sub-pixels SPX can be substantially prevented.

In an embodiment, the number of valid light emitting elements LE that are disposed inside the sub-pixel area SPXA (for example, that function as valid light sources) may be precisely controlled, so that the intensity of light emitted from each of the sub-pixels SPX can be precisely controlled.

For example, the light emitting elements LE may be selectively patterned in the element forming area 2200 on the growth substrate 100, so that the number of light emitting elements LE in the element forming area 2200 can be controlled. Furthermore, because the light emitting elements LE are not disposed over the boundary of the sub-pixel area SPXA, an abnormal contact structure in which only a portion of each of the light emitting elements LE electrically contacts the first electrode CM may be prevented from being formed. For example, the light emitting elements LE may entirely overlap the first electrode CE in a plan view. Therefore, electrical contact surface areas ECS between the light emitting elements LE and the first electrode CM in each of the sub-pixels SPX may be set to be uniform. Uniform current may be applied from the first electrode CM to the light emitting elements LE of each of the sub-pixels SPX, so that each sub-pixel SPX can output light at a desired intensity.

Referring to FIG. 5, a manufacturing method for the display device 10 in accordance with the second embodiment will be schematically described, focused on differences from the first embodiment described above.

In the manufacturing method for the display device 10 in accordance with the second embodiment, two or more element forming areas 2200 may be formed to entirely correspond to two or more sub-pixel areas SPXA. For example, the element forming areas 2200 formed in one row (or one column) may be manufactured to entirely correspond to the sub-pixel areas SPXA formed in one row (or one column). For example, the element forming areas 2200 formed in an area having a given surface area may be manufactured to entirely correspond to the sub-pixel areas SPXA formed in an area having a given surface area.

For example, as shown in the first embodiment, each element forming area 2200 may correspond to a single sub-pixel area SPXA, and as shown in the second embodiment, two or more element forming areas 2200 form a unit, and the light emitting elements LE of the two or more element forming areas 2200 may be transferred to each of the sub-pixel areas SPXA. Two or more processes, which are performed two or more times, may be integrated into a single process, so that processing steps may be simplified.

In an embodiment, the element forming area 2200 may include a first element forming area 2200a, a second element forming area 2200b, and a third element forming area 2200c.

Here, the size of the first element forming area 2200a may be substantially the same as the size of the first sub-pixel area SPXA1. Hence, the light emitting elements LE in the first element forming area 2200a may be transferred to the first sub-pixel area SPXA1. Furthermore, the size of the second element forming area 2200b may be substantially the same as the size of the second sub-pixel area SPXA2. Hence, the light emitting elements LE in the second element forming area 2200b may be transferred to the second sub-pixel area SPXA2. The size of the third element forming area 2200c may be substantially the same as the size of the third sub-pixel area SPXA3. Hence, the light emitting elements LE in the third element forming area 2200c may be transferred to the third sub-pixel area SPXA3.

In an embodiment, a structure in which the first element forming area 2200a, the second element forming area 2200b, and the third element forming area 2200c are disposed may be substantially identical to (or correspond to) a structure in which the first sub-pixel area SPXA1, a second sub-pixel area SPXA2, and a third sub-pixel area SPXA3 are disposed. In other words, the pixel defining pattern 2400a may be patterned to correspond to peripheries of the first sub-pixel area SPXA1, the second sub-pixel area SPXA2, and the third sub-pixel area SPXA3 so that the light emitting elements LE may be collectively transferred to two or more sub-pixel areas SPXA.

Although FIG. 5 illustrates the case where the light emitting elements LE are collectively transferred to three sub-pixel areas SPXA which are successively disposed, the disclosure is not limited thereto.

Hereinafter, respective steps of the manufacturing method for the display device 10 in accordance with an embodiment will be described in more detail with reference to FIGS. 6 to 12. Descriptions overlapping that of the embodiments described above will be simplified, or may not be repeated.

Referring to FIGS. 6 to 9, a process of patterning the light emitting elements LE may be performed. For example, FIGS. 6 to 9 are schematic cross-sectional views schematically illustrating a manufacturing method for the light emitting elements LE.

Figure 6:
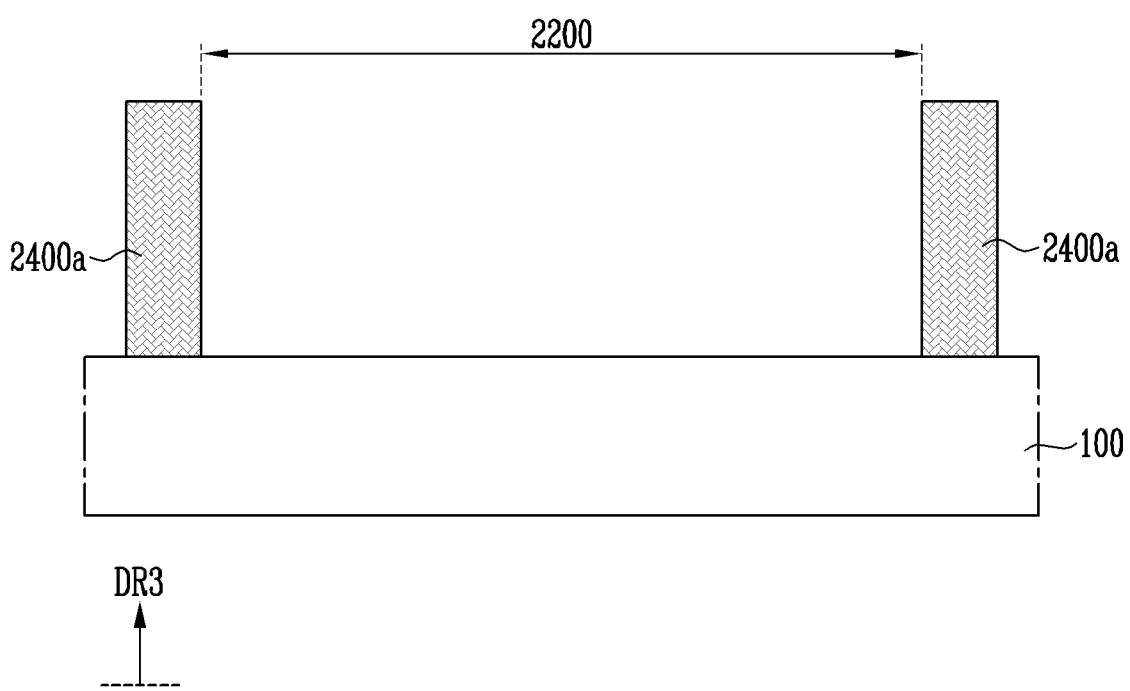
FIGS. 6 to 12 are schematic cross-sectional views illustrating, by process steps, a manufacturing method for the display device in accordance with an embodiment.

Referring to FIG. 6, the pixel defining pattern 2400a may be patterned (or formed) on the growth substrate 100. In an embodiment, the pixel defining pattern 2400a may be disposed to enclose the element forming area 2200. In an embodiment, a height of the pixel defining pattern 2400a is substantially the same as a height of an emission stack structure LE' to be formed through a subsequent process.

In an embodiment, the growth substrate 100 may be a base board for growing a target material. For example, the growth substrate 100 may be a wafer for epitaxial growth of the target material. The growth substrate 100 may be a GaAs, GaP, or InP substrate, and material for forming the growth substrate 100 is not limited to a particular example.

In an embodiment, the pixel defining pattern 2400a may include material suitable for enclosing an area in which the light emitting elements LE are patterned. For example, the pixel defining pattern 2400a may include inorganic material. In an embodiment, the pixel defining pattern 2400a may include inorganic oxide or inorganic nitride and, for example, include silicon oxide ($SiO_x$). However, the disclosure is not limited to the foregoing example.

In an embodiment, before the pixel defining pattern 2400a is formed, an additional semiconductor layer for enhancing crystallization of the semiconductor layers of the light emitting elements LE may be further formed. For example, a buffer layer or the like may be further formed on the growth substrate 100.

Figure 7:
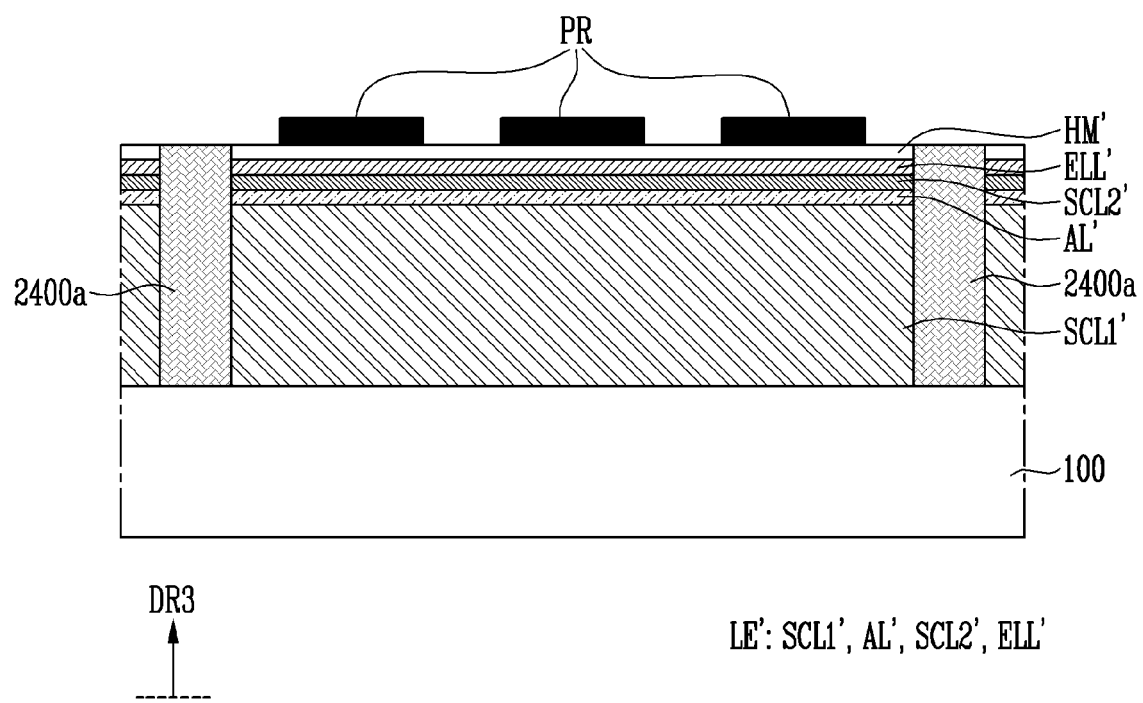

Referring to FIG. 7, a first base semiconductor layer SCL1', a base active layer AL', a second base semiconductor layer SCL2', and a base electrode layer ELL' may be deposited (or formed), thus forming the emission stack structure LE'. Furthermore, the base electrode ELL' may be deposited (or formed) on the second base semiconductor layer SCL2'. A base mask layer HM' and a photoresist layer PR may be formed on the base electrode layer ELL'

In this phase, the base semiconductor layer SCL1', the base active layer AL', and the second base semiconductor layer SCL2' may be formed through an epitaxial growth process. The base electrode layer ELL' may be formed through a sputtering process. In an embodiment, the base semiconductor layer SCL1', the base active layer AL', the second base semiconductor layer SCL2', and the base electrode layer ELL' may be respectively provided to form the first semiconductor layer SCL1, the active layer AL, the second semiconductor layer SCL2, and the electrode layer ELL, and each may include one or more among the materials described above with reference to the respective layers.

In an embodiment, the base mask layer HM' may include an insulating layer, and may be patterned using the photoresist layer PR through a subsequent process and provided as an etching mask layer HM. In an embodiment, the base mask layer HM' may include oxide or nitride and, for example, include silicon oxide ($SiO_x$). The photoresist layer PR may include photosensitive material. In an embodiment, the photoresist layer PR may be disposed to correspond to the area in which the light emitting elements LE are to be formed. For example, the photoresist layer PR may be disposed in at least the element forming area 2200, and may be disposed in an area enclosed by the pixel defining pattern 2400a. The photoresist layer PR may be disposed not to overlap the pixel defining pattern 2400a.

Figure 8:
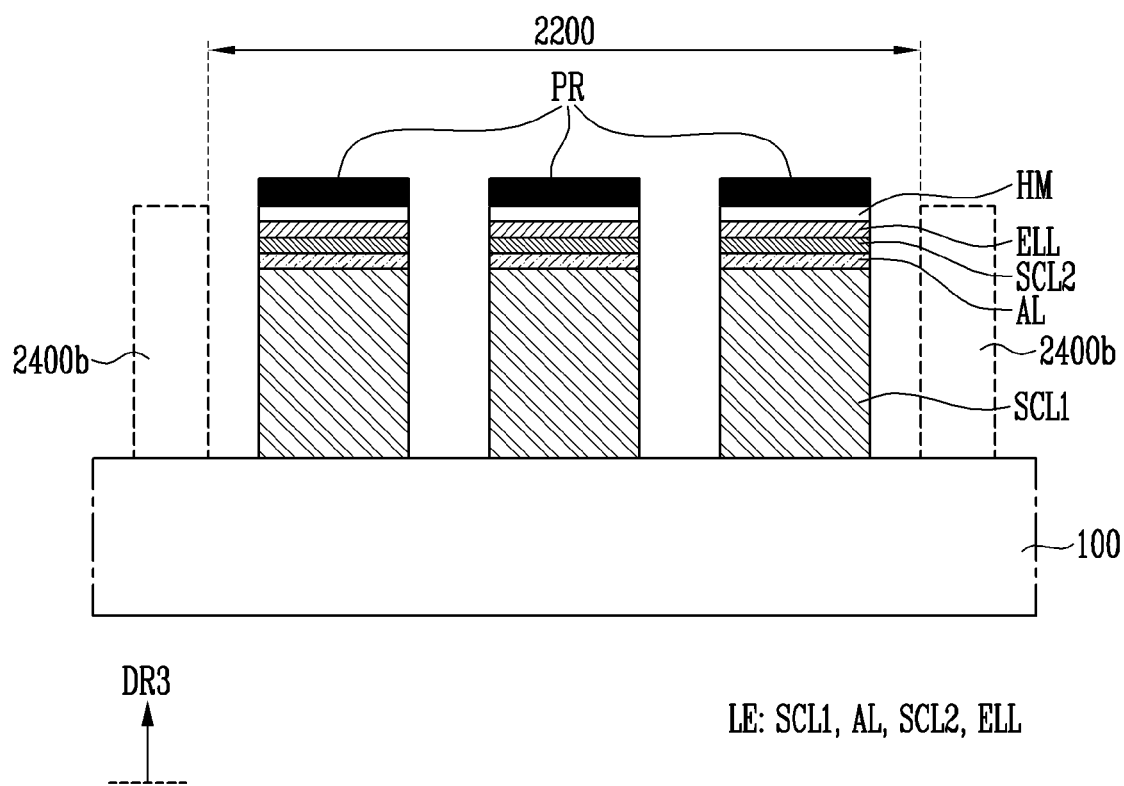

Referring to FIG. 8, at least a portion of the base mask layer HM' may be removed based on a position of the photoresist layer PR, whereby the etching mask layer HM may be formed. The emission stack structure LE' may be etched using the etching mask layer HM. Thereafter, the pixel boundary line 2400b may be formed by removing the pixel defining pattern 2400a.

In this phase, the emission stack structure LE' may be patterned through a dry etching process, and light emitting elements LE which are individually spaced apart from each other may be formed. For example, the emission stack structure LE' may be etched in a vertical direction of the emission stack structure LE' In an embodiment, the emission stack structure LE' may be etched such that the light emitting elements LE are spaced apart from each other by a given distance. In this phase, the formed light emitting elements LE may be patterned in the element forming area 2200, and may not overlap the pixel boundary line 2400b.

In an embodiment, dry etching methods such as a reactive ion etching (RIE) method, a reactive ion beam etching (RIBE) method, or an inductively coupled plasma reactive ion etching (ICP-RIE) method may be used in the dry etching process.

Figure 9:
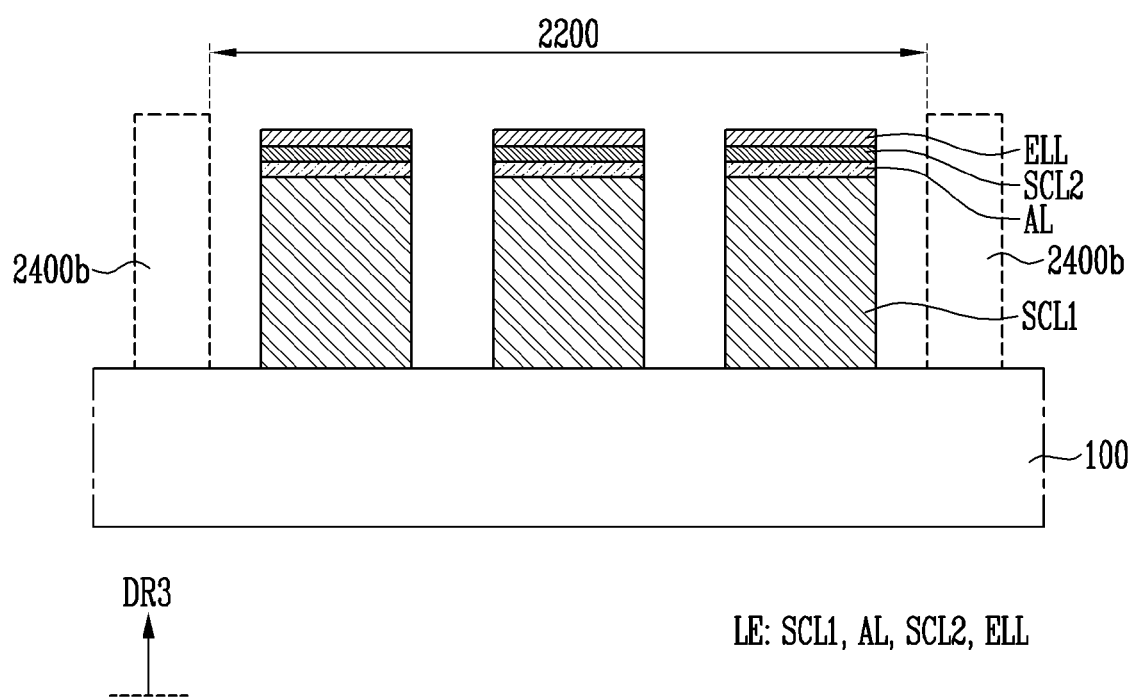

Referring to FIG. 9, the etching mask HM and the photoresist layer PR may be removed. In an embodiment, the etching mask HM and the photoresist layer PR may be removed through a wet etching process.

Therefore, the light emitting elements LE may be individually patterned on the growth substrate 100. As described above, the light emitting elements LE may be patterned in the element forming area 2200 formed to correspond to the sub-pixel area SPXA.

Figure 10:
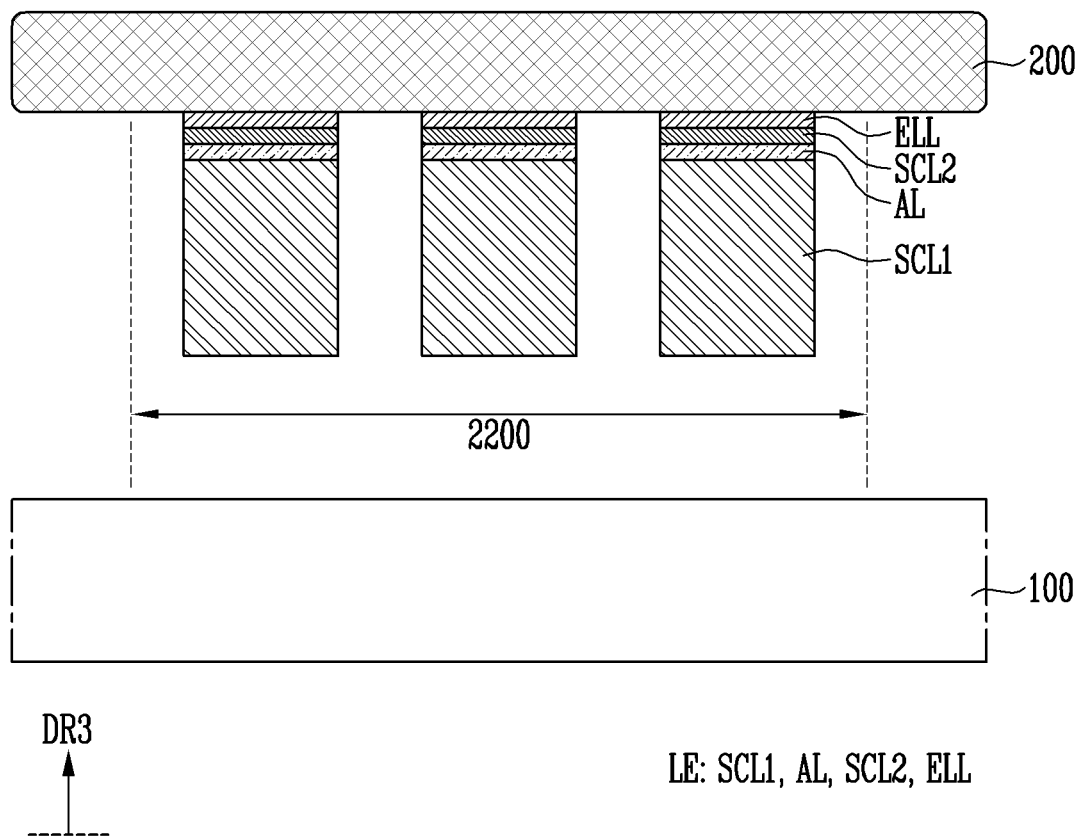
Figure 11:
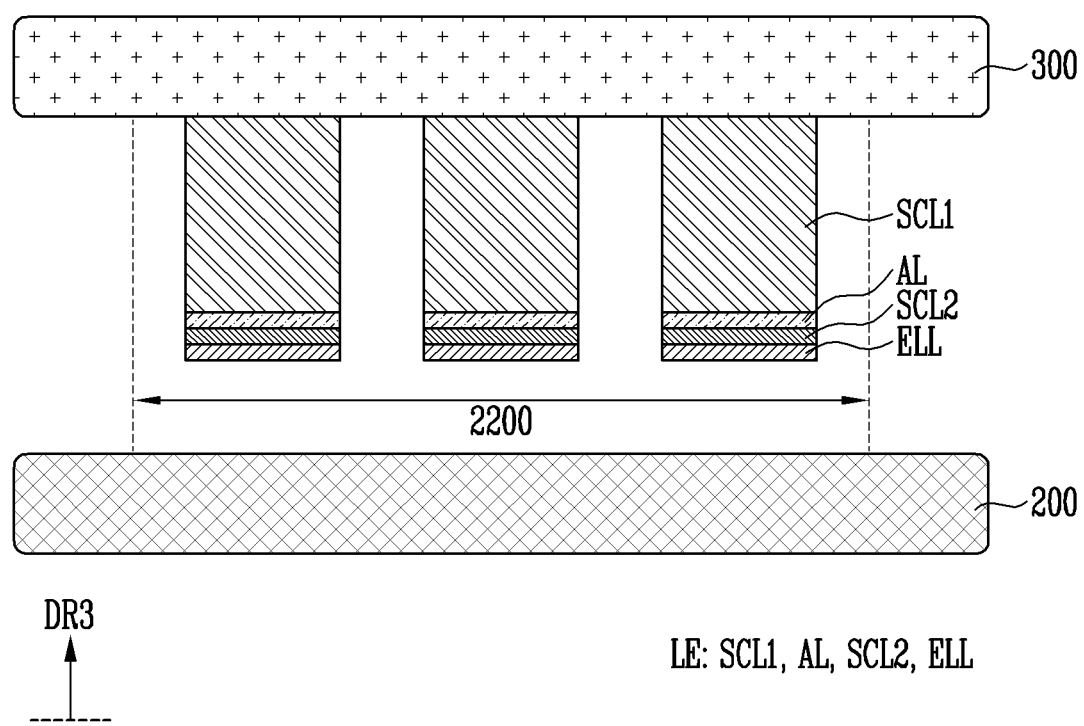
Figure 12:
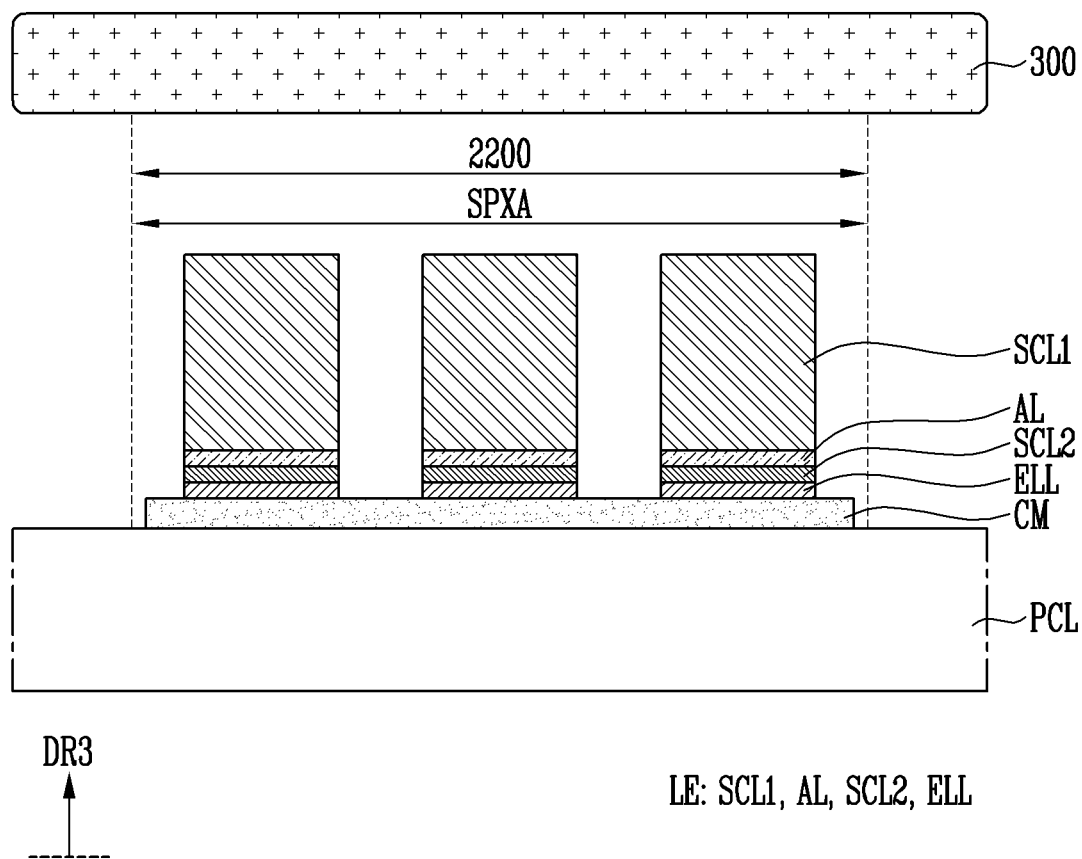

Referring to FIGS. 10 to 12, a process of transferring the light emitting elements LE on the pixel circuit layer PCL may be performed.

Referring to FIG. 10, the light emitting elements LE may be attached on a carrier wafer 200 and separated from the growth substrate 100. The light emitting elements LE may be disposed to correspond to the element forming area 2200 on the carrier wafer 200.

In this phase, an attachment film having adhesive force may be formed on the carrier wafer 200. The light emitting elements LE may be provided on the carrier wafer 200. In an embodiment, the carrier wafer 200 may be a component which is temporarily bonded to another component to allow a subsequent process to be performed. After the subsequent process is performed, the carrier wafer 200 may be debonded from the corresponding component.

Referring to FIG. 11, the light emitting elements LE on the carrier wafer 200 may be moved to a transfer apparatus 300.

In an embodiment, to transfer the light emitting elements LE, various schemes may be used. For example, the light emitting elements LE may be transferred using at least one of apparatuses each using at least one of a transfer scheme using a stamp, a transfer scheme using a laser, a transfer scheme using electrostatic force, a transfer scheme using magnetic force and electromagnetic force, and a transfer scheme using adhesive. In the specification, for convenience of explanation, descriptions will be made based on an embodiment in which the transfer apparatus 300 is implemented as an apparatus employing a transfer scheme using a stamp.

In this phase, the light emitting elements LE may be separated from the carrier wafer 200 and attached to a stamp of the transfer apparatus 300. Here, the light emitting elements LE that are attached to the stamp may be arranged or disposed in substantially the same arrangement structure as that formed on the growth substrate 100. Hence, the light emitting elements LE may be disposed to correspond to the element forming area 2200 on the stamp.

Referring to FIG. 12, the transfer device 300 including the stamp may transfer the light emitting elements LE on the first electrode CM on the pixel circuit layer PCL.

For example, the transfer apparatus 300 may move the light emitting elements LE on the first electrode CM, and attach and electrically connect the light emitting elements LE to the first electrode CM through a heat bonding scheme.

In this phase, the light emitting elements LE defined in the element forming area 2200 may be disposed in the corresponding sub-pixel area SPXA. Consequently, the light emitting elements LE may be accurately aligned in a desired area, and be reliably electrically connected to the first electrode CM.

Hereinafter, an application field of the display device 10 in accordance with an embodiment will be described with reference to FIGS. 13 to 16. Here, the application field of the display device 10 is not limited to the following examples. FIGS. 13 to 16 are schematic diagrams illustrating an application example of the display device 10 in accordance with an embodiment.

Figure 13:
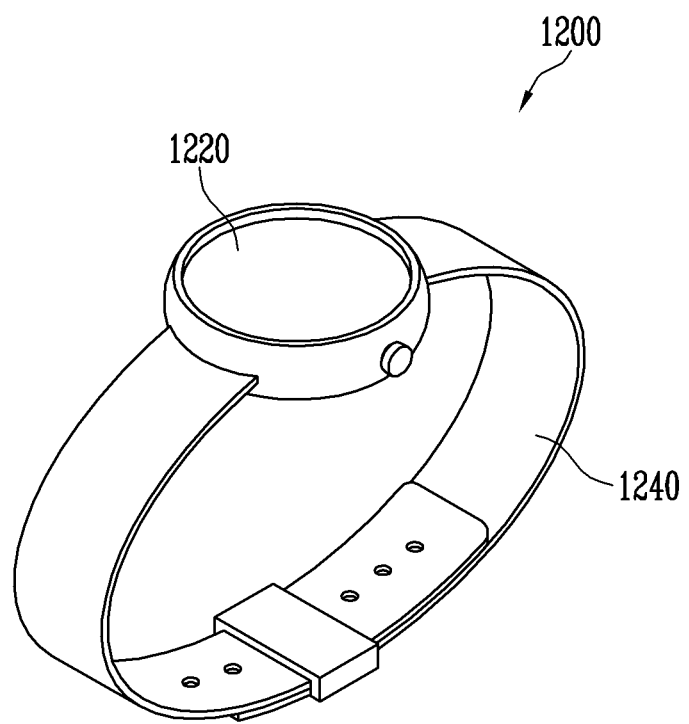
FIGS. 13 to 16 are schematic diagrams illustrating an application example of the display device in accordance with an embodiment.

Referring to FIG. 13, the display device 10 may be applied to a smart watch 1200 including a display component 1220 and a strap 1240.

The smart watch 1200 may be a wearable electronic device, and have a structure such that the strap 1240 is worn on the wrist of a user. Here, the display device 10 is applied to the display component 1220, so that image data including time information may be provided to the user.

Figure 14:
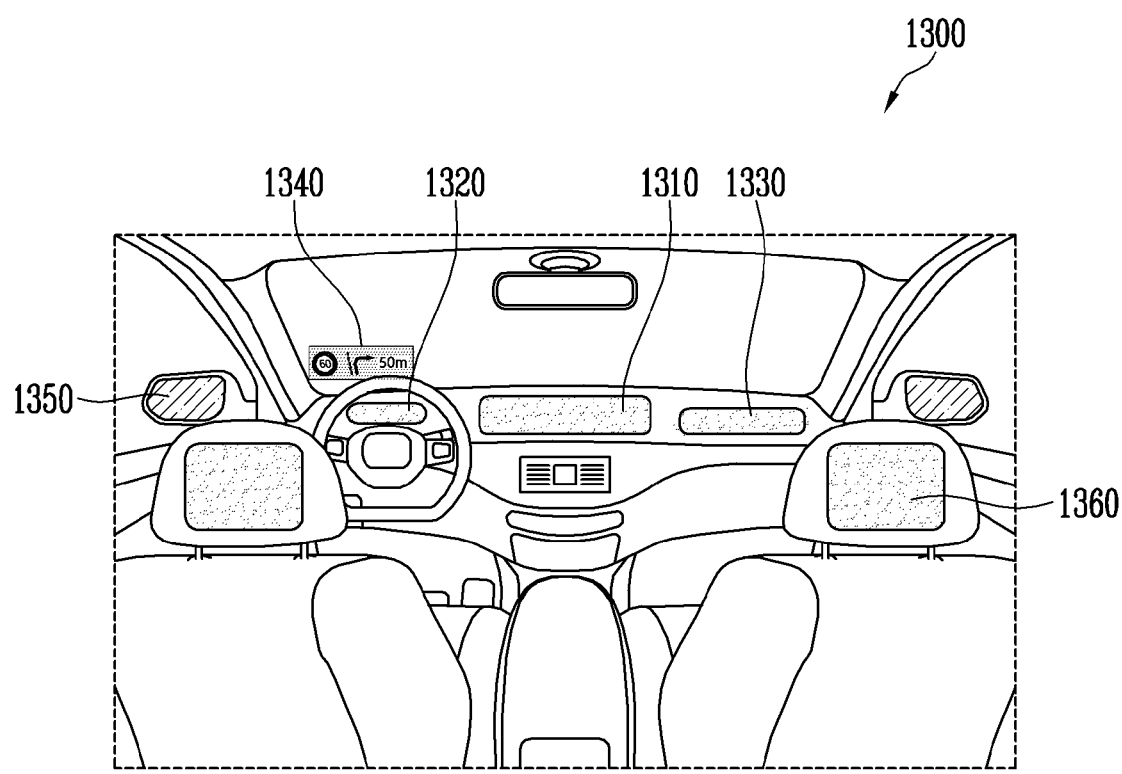

Referring to FIG. 14, the display device 10 may be applied to an automotive display 1300. Here, the automotive display 1300 may be an electronic device which is provided inside or outside a vehicle to provide image data.

For example, the display device 10 may be applied to at least one of an infortainment panel 1310, a cluster 1320, a co-driver display 1330, a head-up display 1340, a side mirror display 1350, and a rear seat display 1360, which may be provided in the vehicle.

Figure 15:
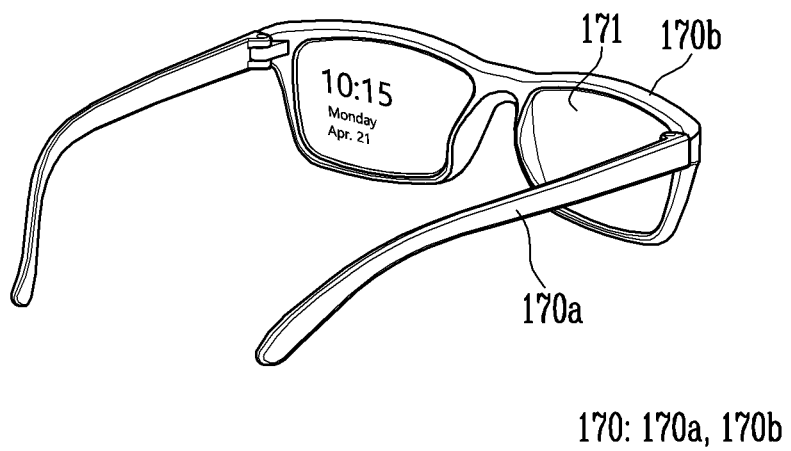

Referring to FIG. 15, the display device 10 may be applied to smart glasses including a frame 170 and a lens 171. The smart glasses are a wearable electronic device, which is worn on the face of the user, and may have a structure such that a portion of the frame 170 can be folded or unfolded. For example, the smart glasses may be a wearable device for augmented reality (AR).

The frame 170 may include a housing 170b which support the lens 171, and a leg 170a enabling the user to wear the smart glasses. The leg 170a is coupled or connected to the housing 170b by a hinge and thus can be folded or unfolded.

The frame 170 may be equipped with a battery, a touch pad, a microphone, a camera, and the like within the spirit and the scope of the disclosure. Furthermore, the frame 170 may be equipped with a projector that outputs light, and a processor that controls a light signal and the like within the spirit and the scope of the disclosure.

The lens 171 may be an optical component that transmits or reflects light. The lens 171 may include glass, transparent synthetic resin, and the like within the spirit and the scope of the disclosure.

Furthermore, the lens 171 enables image formed by an optical signal transmitted from the protector of the frame 170 to be reflected by a rear surface of the lens 171 (for example, a surface of the lens 171 that faces the eyes of the user) and thus recognized by the eyes of the user. For example, as illustrated in the drawing, the user may recognize information such as the time and the date displayed on the lens 171. In other words, the lens 171 may be a kind of display device. The display device 10 may be applied to the lens 171.

Figure 16:
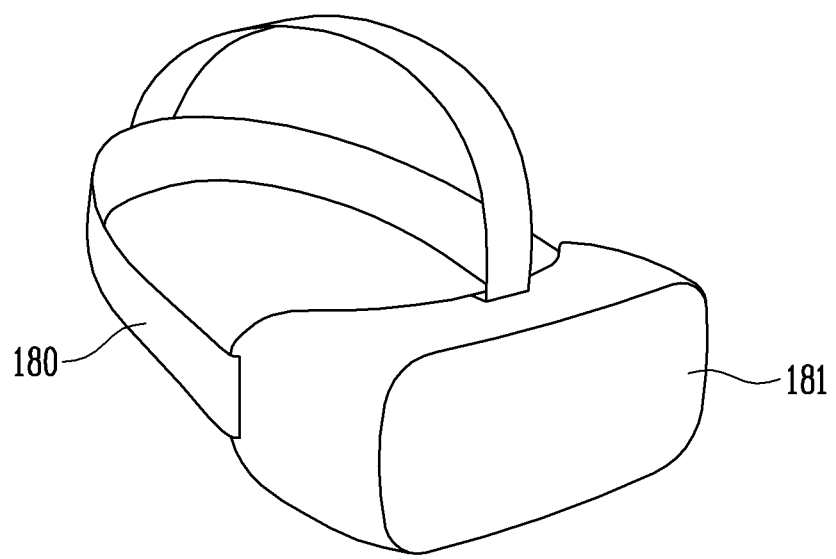

Referring to FIG. 16, the display 10 may be applied to a head mounted display (HMD) including a head mounting band 180 and a display receiving casing 181. The HMD may be a wearable electronic device which may be worn on the head of the user.

The head mounting band 180 is coupled or connected to the display receiving casing 181 and functions to mount the display receiving casing 181 on the head of the user. Although in the drawing there is an example in which the head mounting bank 180 is able to enclose an upper surface and opposite sides of the head of the user, the disclosure is not limited thereto. The head mounting bank 180 is provided to fasten the head mounting display to the head of the user, and may be provided in the form of a glasses frame or a helmet.

The display receiving case 181 may receive the display device 10, and include at least one lens. The at least one lens may provide an image to the user. For example, the display device 10 may be applied to a left-eye lens and a right-eye lens which are embodied in the display receiving casing 181.

Various embodiments may provide a display device which is improved in an alignment of light emitting elements, a manufacturing method for the display device, and a manufacturing method for a light emitting element.

Various embodiments may provide a display device capable of precisely controlling the number of light emitting elements that function as valid light sources and the quantity of light emitted from the light emitting elements, a manufacturing method for the display device, and a manufacturing method for a light emitting element.

While various embodiments have been described above, those skilled in the art will appreciate that various modifications, additions and substitutions are possible, without departing from the scope and spirit of the disclosure.

Therefore, embodiments disclosed in this specification are only for illustrative purposes rather than limiting the technical spirit and scope of the disclosure. The scope of the disclosure is also defined by the accompanying claims.

What is claimed is:

1. A manufacturing method for a display device, comprising:
    patterning a pixel defining pattern on a substrate;
    forming an emission stack structure;

forming light emitting elements by etching the emission stack structure; and transferring the light emitting elements on a base layer and a pixel circuit layer including a pixel circuit on the base layer, wherein the forming of the light emitting elements comprises patterning the light emitting elements in an element forming area enclosed by the pixel defining pattern, and the transferring of the light emitting elements comprises disposing the light emitting elements in a sub-pixel area corresponding to the element forming area on the pixel circuit layer.

2. The manufacturing method according to claim 1, wherein a shape of the element forming area and a shape of the sub-pixel area are substantially identical.

3. The manufacturing method according to claim 1, wherein the patterning of the pixel defining pattern is performed before forming the light emitting elements.

4. The manufacturing method according to claim 1, further comprising:

forming a pixel boundary line by removing the pixel defining pattern, wherein the light emitting elements do not overlap the pixel boundary line in a plan view.

5. The manufacturing method according to claim 4, wherein the forming of the light emitting elements further comprises disposing the light emitting elements in an area enclosed by the pixel boundary line.

6. The manufacturing method according to claim 5, wherein the transferring of the light emitting elements comprises determining a transfer position of the light emitting elements based on the pixel boundary line.

7. The manufacturing method according to claim 1, wherein the transferring of the light emitting elements is performed using at least one of apparatuses each using at least one of a transfer using a stamp, a transfer using a laser, a transfer using an electrostatic force, a transfer using a magnetic force and an electromagnetic force, or a transfer using an adhesive.

8. The manufacturing method according to claim 1, wherein the transferring of the light emitting elements comprises disposing the light emitting elements on a bonding electrode disposed on the pixel circuit layer.

9. The manufacturing method according to claim 8, wherein each of the light emitting elements on the bonding electrode forms a substantially identical surface area in an electrical contact surface with the bonding electrode.

10. The manufacturing method according to claim 1, wherein the element forming area and the sub-pixel area are one to one with each other.

11. The manufacturing method according to claim 1, wherein the element forming area includes element forming areas, the sub-pixel area includes sub-pixel areas, and an arrangement structure of the element forming areas is substantially identical to an arrangement structure of the sub-pixel areas.

12. The manufacturing method according to claim 11, wherein the transferring of the light emitting elements comprises collectively transferring the light emitting elements disposed in the element forming areas to the sub-pixel areas.

13. The manufacturing method according to claim 1, wherein the pixel defining pattern includes an inorganic material.

14. The manufacturing method according to claim 1, wherein the forming of the emission stack structure comprises forming a first base semiconductor layer including a first type semiconductor, a base active layer, and a second base semiconductor layer including a second type semiconductor different from the first type semiconductor.

15. The manufacturing method according to claim 1, further comprising:

forming a photoresist layer to form an etching mask for the emission stack structure on the emission stack structure, wherein the photoresist layer does not overlap the pixel defining pattern in a plan view.

16. A manufacturing method for a light emitting element, comprising:

patterning a pixel defining pattern that encloses an element forming area including light emitting elements to be patterned on a substrate; and forming an emission stack structure on the substrate, and forming light emitting elements by etching the emission stack structure such that the light emitting elements are selectively disposed in the element forming area.

17. A display device comprising:

a pixel circuit layer including a base layer and a pixel circuit; and a light-emitting-element layer disposed on the pixel circuit layer, and including a first electrode, light emitting elements, and a second electrode, wherein the light emitting elements are electrically connected to the first electrode and the second electrode, and are disposed on the first electrode, and each of the light emitting elements has a substantially identical surface area in an electrical contact surface with the first electrode.

18. The display device according to claim 17, wherein the pixel circuit layer comprises a driving transistor, and the first electrode electrically connects the driving transistor with the light emitting elements.

19. The display device according to claim 17, wherein the light emitting elements entirely overlap the first electrode, in a plan view.

20. The display device according to claim 19, further comprising:

a first sub-pixel and a second sub-pixel each including the first electrode and the light emitting elements, wherein the first electrode of the first sub-pixel is electrically disconnected from the first electrode of the second sub-pixel, the light emitting elements of the first sub-pixel are electrically disconnected from the first electrode of the second sub-pixel, and the light emitting elements of the second sub-pixel are electrically disconnected from the first electrode of the first sub-pixel.

* * * * *